(12) United States Patent
Fang et al.

(10) Patent No.: US 7,910,476 B2
(45) Date of Patent: Mar. 22, 2011

(54) ADHESION AND MINIMIZING OXIDATION ON ELECTROLESS CO ALLOY FILMS FOR INTEGRATION WITH LOW K INTER-METAL DIELECTRIC AND ETCH STOP

(75) Inventors: Hongbin Fang, San Jose, CA (US); Timothy Weidman, Sunnyvale, CA (US); Fang Mei, Foster City, CA (US); Yaxin Wang, Fremont, CA (US); Arulkumar Shanmugasundram, Sunnyvale, CA (US); Christopher D. Bencher, San Jose, CA (US); Mehul B. Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/240,744

(22) Filed: Sep. 29, 2008

(65) Prior Publication Data
US 2009/0029544 A1 Jan. 29, 2009

Related U.S. Application Data

(63) Continuation of application No. 11/329,785, filed on Jan. 10, 2006, now abandoned.

(60) Provisional application No. 60/731,170, filed on Oct. 28, 2005.

(51) Int. Cl.
*H01L 21/4763* (2006.01)

(52) U.S. Cl. .............. 438/628; 438/644; 257/E21.584

(58) Field of Classification Search .................. 438/628, 438/644
See application file for complete search history.

(56) References Cited

U.S. PATENT DOCUMENTS

| | | | |
|---|---|---|---|
| 6,271,122 B1 * | 8/2001 | Wieczorek et al. | 438/627 |
| 6,458,722 B1 * | 10/2002 | Kapoor et al. | 438/788 |
| 6,734,102 B2 * | 5/2004 | Rathi et al. | 438/687 |
| 2003/0001275 A1 * | 1/2003 | Sambucetti et al. | 257/762 |
| 2005/0147762 A1 * | 7/2005 | Dubin et al. | 427/437 |

FOREIGN PATENT DOCUMENTS

| | | |
|---|---|---|
| JP | 2003179000 | 6/2003 |
| KR | 20010082118 | 8/2001 |
| KR | 20040003232 | 1/2004 |
| KR | 20040008593 | 1/2004 |

OTHER PUBLICATIONS

Korean Office Action, Patent Application No. 10-2006-0104898, dated Aug. 21, 2008.
Taiwan Office Action, Patent Application No. 095139775, dated Jan. 6, 2009.

* cited by examiner

*Primary Examiner* — Matthew C Landau
*Assistant Examiner* — Daniel Luke
(74) *Attorney, Agent, or Firm* — Patterson & Sheridan, LLP

(57) ABSTRACT

A method and apparatus for processing a semiconductor substrate including depositing a capping layer upon a conductive material formed on the substrate, reducing oxide formation on the capping layer, and then depositing a dielectric material. A method and apparatus for processing a semiconductor substrate including depositing a capping layer upon a conductive material formed on a substrate, exposing the capping layer to a plasma, heating the substrate to more than about 100° C., and depositing a low dielectric constant material.

23 Claims, 9 Drawing Sheets

ADHESION AND MINIMIZING OXIDATION ON ELECTROLESS CO ALLOY FILMS FOR INTEGRATION WITH LOW K INTER-METAL DIELECTRIC AND ETCH STOP

CROSS-REFERENCE TO RELATED APPLICATIONS

This application is a continuation of U.S. Ser. No. 11/329,785, filed Jan. 10, 2006, now abandoned which claims benefit of provisional patent application Ser. No. 60/731,170 (APPM/10658L/PPC/ELESS/CKIM), filed Oct. 28, 2005, which are herein incorporated by reference in their entirety.

BACKGROUND OF THE INVENTION

1. Field of the Invention

Embodiments of the present invention generally relate to a process of reliably forming devices on a semiconductor substrate.

2. Description of the Related Art

Currently, copper and its alloys are the metals of choice for sub-micron interconnect technology because copper (Cu) has a low resistivity, a high current carrying capacity, and high electromigration resistance. However, despite the positive attributes of Cu, Cu interconnects are susceptible to copper diffusion, electromigration related failures, and oxidation related failures. Typically, a liner barrier layer is used to encapsulate the sides and bottom of the Cu interconnect to prevent diffusion of Cu to the adjacent dielectric layers. The oxidation and electromigration related failures of Cu interconnects can be significantly reduced by depositing a thin metal capping layer of, for example, cobalt tungsten phosphorus (CoWP), cobalt tin phosphorus (CoSnP), and cobalt tungsten phosphorus boron (CoWPB), on the surface of the Cu interconnect. After depositing a capping layer and subsequent dielectric layers, high processing temperatures reaching 400° C. to 450° C. for periods of about 8 hours during back-end-of-the-line (BEOL) layer processing and chip packaging leads to delamination of the subsequently deposited dielectric layers from the capping layer if adhesion between the capping layer and dielectric layer is poor. Lags in the processing sequence may also encourage oxidation. In particular, oxidation is particularly detrimental in thinner capping layers having thicknesses of less than about 150 Å, for example, a 70 Å layer of CoWP or CoWPB. Increasing adhesion and decreasing the concentration of oxides across the surface of the deposited capping layer over the Cu interconnect is needed to prevent delamination of the subsequently deposited dielectric layers.

FIG. 1 (prior art) is a sectional view of a formed feature. The feature is formed on a substrate surface 11. A dielectric layer 14 is deposited on the substrate 11. A via 10 is formed in the dielectric layer 14. A barrier layer 12 is deposited in the via 10. Copper or other conductive material 13 is deposited on the barrier layer 12. The conductive material 13 is then planarized and a capping layer 22 is deposited on the conductive material 13. Next, a dielectric layer 16 with a low dielectric constant is deposited on the dielectric layer 14 and the capping layer 22. An interface 17 is formed between the capping layer 22 and the dielectric layer 16. Then, an additional dielectric layer 18 is deposited. The additional dielectric layer may be fluorosilicate glass (FSG), amorphous silicon, silicon oxycarbide, or other dielectric selected for its dielectric constant or other properties. The dielectric layers 18 and 16 may be one continuous dielectric layer composite 15. Next, a photoresist is deposited upon the surface of the dielectric layer 18. The photoresist is patterned and the underlying dielectric composite 15 is also patterned. As the dielectric layer 16 is patterned, the interface 17 between the capping layer 22 and dielectric layer 16 may lose integrity and deform. Specifically, if there is limited adhesion between the capping layer 22 and the dielectric layer 16, the capping layer 22 and dielectric layer 16 may delaminate, leading to device failure.

Historically, the capping layer has been deposited, quickly followed by depositing the dielectric layer. FIG. 7 (prior art) illustrates a process 50 for depositing a low dielectric constant film on the capping layer. The substrate is preheated in an oxygen containing environment in step 51. Next, a silicon containing precursor such as silane or tetraethyl orthosilicate $(Si(OC_2H_5)_4$, tetraethyloxysilane, or TEOS) is introduced into the chamber in step 52. Then, the plasma is ignited in step 53. The bulk dielectric layer is deposited in step 54. Because capping layer 22 is susceptible to oxidation, the above process 50 results in oxidation of the capping layer 22 and poor adhesion between the capping layer 22 and low K dielectric layer.

Improved methods and apparatus are needed to deposit and treat a capping layer to increase the adhesion between a capping layer and a dielectric layer. The improved method and apparatus may provide a capping layer with improved copper diffusion barrier properties. The improved copper diffusion barrier may also be an etch stop. Thus, the dielectric capping layer, such as layer 16, may be eliminated from the process, and a low K dielectric may be deposited directly on the capping layer.

SUMMARY OF THE INVENTION

The present invention generally provides method and apparatus for processing a semiconductor substrate including depositing a capping layer upon a conductive material formed on the substrate, reducing oxide formation on the capping layer, and then depositing a dielectric material. The present invention also generally provides a method and apparatus for processing a semiconductor substrate including depositing a capping layer upon a conductive material formed on a substrate, exposing the capping layer to a plasma, heating the substrate to more than about 100° C., and depositing a low dielectric constant material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally pertain to a process of forming reliable interconnect layers to improve the adhesion between a capping layer and a subsequently deposited dielectric layer, which is desirable to improve final device performance. Hindering oxide formation along the surface of the capping layer helps improve adhesion and final device performance.

Figure 1:
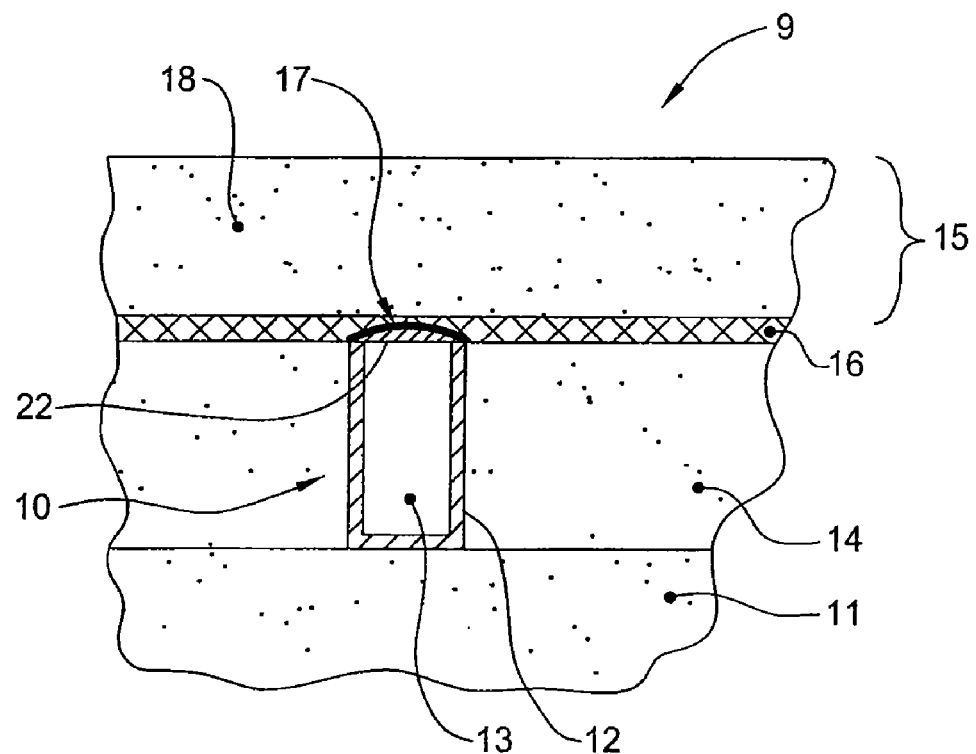
FIG. 1 (prior art) is a sectional view of a formed feature.
Figure 2:
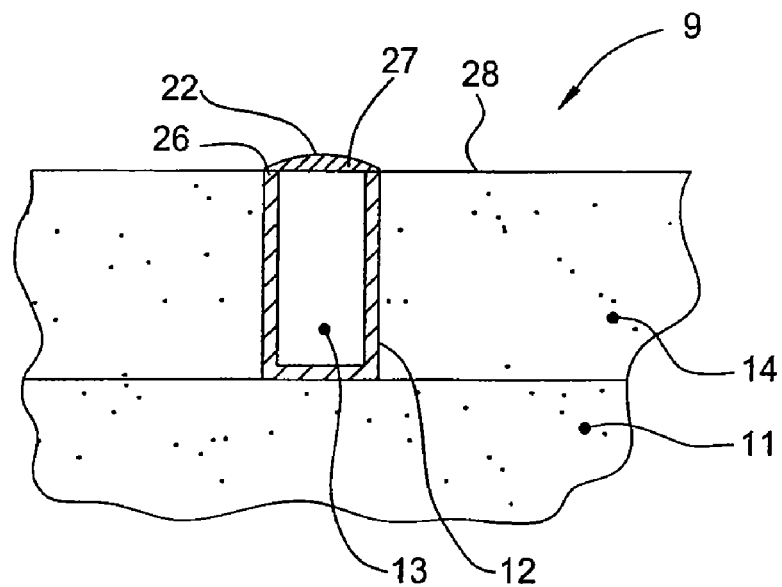
FIG. 2 is a sectional view of an embodiment of a formed feature.

FIG. 2 is a sectional view of an embodiment of a formed feature. FIG. 2 illustrates a cross-sectional view of an interconnect 9 containing a conductive fill material 13 disposed within an interconnect opening with a barrier layer 12 formed in a dielectric material 14. In one embodiment, the dielectric material 14 is a low dielectric constant (low k) dielectric material, such as, a Black Diamond™ film, available from Applied Materials, Inc. of Santa Clara, Calif.; CORAL™ film, available from Novellus Systems Inc. of San Jose, Calif., AURORA™ film available from ASM International of Bilthoven, Netherlands; organosilanes or organosiloxanes; spin on dielectrics; carbon doped oxides; silicates; and any other suitable material. Interconnect 9, as well as other semiconductor features, are disposed on a substrate 11. Substrates on which embodiments of the invention may be useful include, but are not limited to, crystalline silicon (e.g., Si<100> or Si<111>), silicon oxide, silicon germanium, doped or undoped polysilicon, doped or undoped silicon, and silicon nitride. Other substrates may include bare silicon wafers, or substrates having conductive or non-conductive layers thereon, such as layers comprising materials having dielectric, conductive, or barrier properties, including aluminum oxide and polysilicon, and pretreated surfaces. Pretreatment of surfaces may include one or more of polishing (e.g., CMP, electro-polishing), patterning, etching, reduction, oxidation, hydroxylation, annealing and baking. The term substrate surface is used herein to include any semiconductor feature, including the exposed surfaces of interconnect features, such as the top, bottom, and/or side walls of vias, lines, dual damascenes, contacts and the like.

Multiple electronic device features, such as trenches and holes, may be formed in the dielectric material 14. A liner barrier layer 12 is used to separate the dielectric material 14 from the conductive fill material 13. Liner barrier layer 12 may include materials such as titanium, titanium nitride, tantalum, tantalum nitride, tantalum silicon nitride, tungsten nitride, silicon nitride, and combinations thereof which are usually deposited by physical vapor deposition (PVD), atomic layer deposition (ALD), and chemical vapor deposition (CVD) techniques. Conductive fill material 13 includes metals such as copper (Cu), aluminum (Al), tungsten (W), and various alloys of the aforementioned metals, and preferably, the conductive fill material 13 is Cu or Cu alloy for forming the interconnect 9 structure (e.g., line or via). The conductive fill material 13 is generally deposited by a deposition process, such as electroplating, electroless plating, CVD, PVD, ALD, and/or combinations thereof. A layer of conductive fill material is deposited and then polished or leveled, by techniques such as electrochemical polishing and/or CMP, to form the interconnect 9 structure depicted in FIG. 2, having a conductive surface 27 and dielectric surface 28. The conductive surface 27 is generally defined as the surface of the filled trenches and holes containing the conductive material 13 and the liner barrier layer 26 that has been exposed after the CMP process. After polishing, the dielectric surface 28 is typically cleaned to remove polishing residue and other contaminants.

FIG. 2 also depicts a cross-sectional view of interconnect 9 including a cobalt-containing alloy layer 22 that is a capping layer deposited on the conductive material 13. The cobalt-containing alloy layer 22 is selectively deposited by exposing the conductive material 13 to a plating solution such as those described by U.S. patent application Ser. No. 10/967,644, filed Oct. 15, 2004, which is hereby incorporated by reference herein. The cobalt-containing alloy layer is deposited with a thickness from about an atomic layer to about 500 Å, preferably from about 10 Å to about 300 Å and more preferably from about 50 Å to about 200 Å. The cobalt-containing alloy layer 22 may be deposited in several steps. For example, the substrate surface is exposed to a first volume of plating solution to deposit a first layer with a first thickness (e.g., 100 Å) and the substrate surface is exposed to a second volume of plating solution to deposit a second layer with a second thickness (e.g., 100 Å) to form an overall cobalt-containing alloy layer.

The cobalt-containing alloy layer may include a variety of compositions containing cobalt, tungsten or molybdenum, phosphorus, boron, and combinations thereof. Generally, cobalt-containing alloys have a composition in atomic percent, such as a cobalt concentration in a range from about 85% to about 95%, a tungsten concentration in a range from about 1% to about 6% or a molybdenum concentration in a range from about 1% to about 6%, and a phosphorus concentration in a range from about 1% to about 12%, preferably from about 3% to about 9%. A variable amount of boron may be present in cobalt-containing alloys prepared with the methods of the invention due to the inclusion of a borane reductant. In some embodiments, the substitution of molybdenum for tungsten may have economic advantages during the deposition of cobalt-containing alloys.

The concentration of phosphorus and/or boron within a cobalt-containing alloy layer can affect the deposited capping layer final crystalline structure. Generally, the barrier properties such as the ability to prevent diffusion of copper, oxygen or water) increases as the capping layer becomes more amorphous. Alternatively, the effect of phosphorus or boron may result from the "stuffing" of grain boundaries which can tend to inhibit copper diffusion through the capping layer.

Generally, oxygen is unintentionally incorporated into cobalt-containing alloys by exposing capping layer to an ambient environment before dielectric film is deposited. The metal oxides are generally near the surface of the cobalt-containing alloy. Substantial amounts of oxygen are not desirable within a cobalt-containing alloy, because barrier properties and conductivity are reduced as oxygen concentration increases. Adhesion of subsequently deposited dielectric material may be diminished. In some embodiments of the invention, oxygen concentration of the cobalt-containing alloy is minimized to range from about $5 \times 10^{18}$ atoms/cm$^3$ to about $5 \times 10^{19}$ atoms/cm$^3$. The lower oxygen concentration is partially because of the more efficient reduction of the cobalt-containing alloy resulting from the precursors, such as the hypophosphite source and the borane-based co-reductant, and the relative high concentration ratio of metal ions to reductant.

Figure 3:
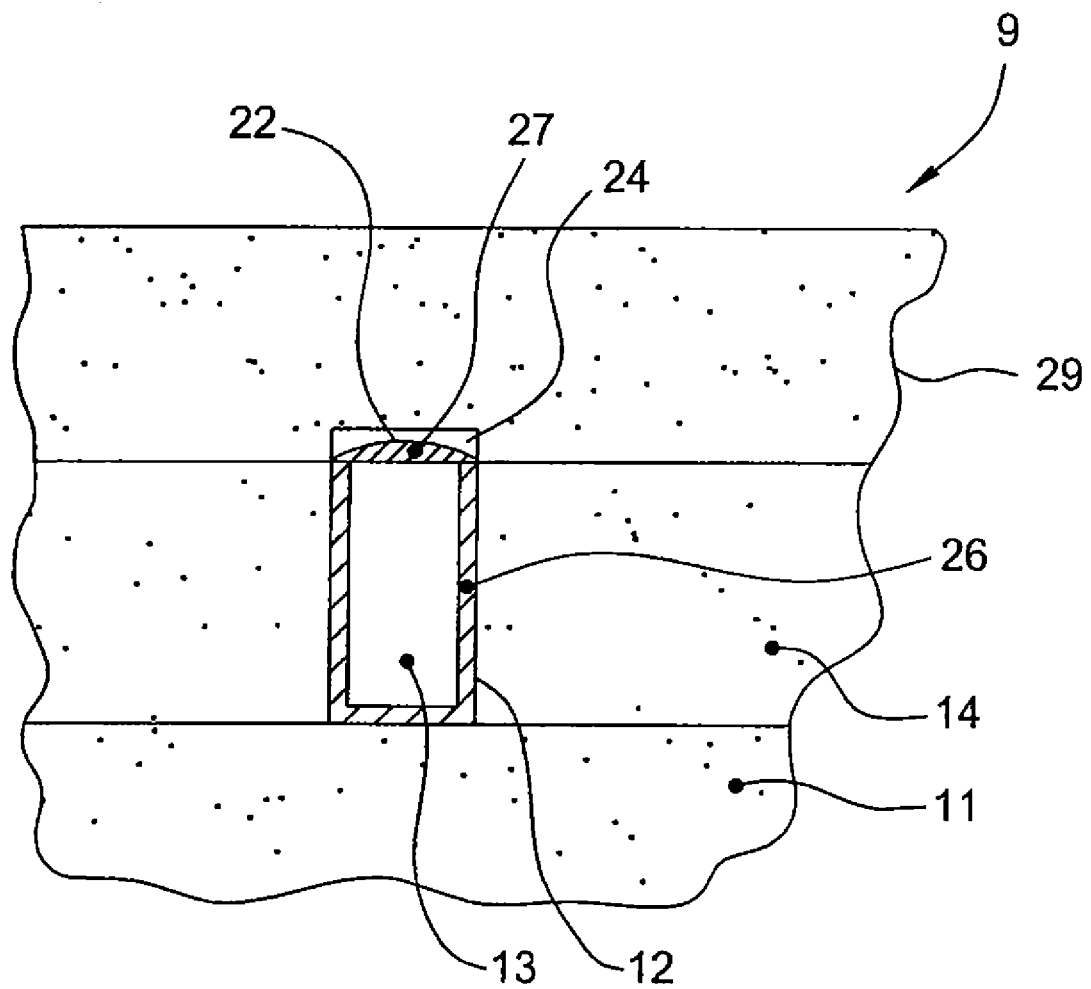
FIG. 3 is a sectional view of an additional embodiment of a formed feature.

FIG. 3 is a sectional view of an additional embodiment of a formed feature. The feature of FIG. 2 may undergo further processing steps. A silicide layer 24 may be selectively deposited on the capping layer 22. The silicide layer 24 may be formed with a silicon containing precursor. The preferred precursor is silane ($SiH_4$). FIG. 3 also illustrates a dielectric layer 29 deposited upon the surface of the silicide layer 24. The dielectric layer may be fluorosilicate glass (FSG), amorphous silicon, or other dielectric selected for its dielectric constant or other properties.

Figure 4:
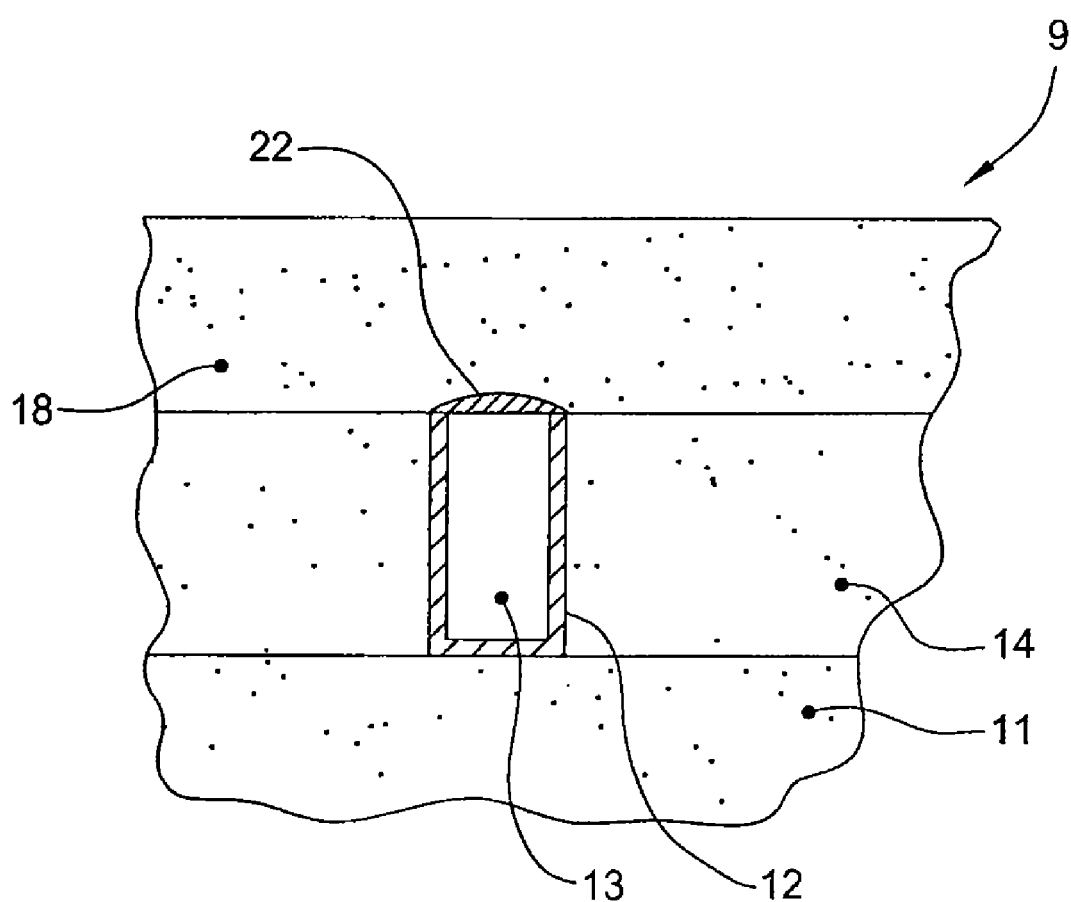
FIG. 4 is a sectional view of an additional embodiment of a formed feature.

FIG. 4 is a sectional view of an additional embodiment of a formed feature. FIG. 4 is comparable to FIG. 2. However, FIG. 4 has a dielectric layer 18 in direct contact with the upper surface of the capping layer 22. The upper surface of capping layer 22 may undergo annealing or plasma treatment to improve the adhesion properties of the interface between the capping layer 22 and the dielectric layer 18.

Figure 5:
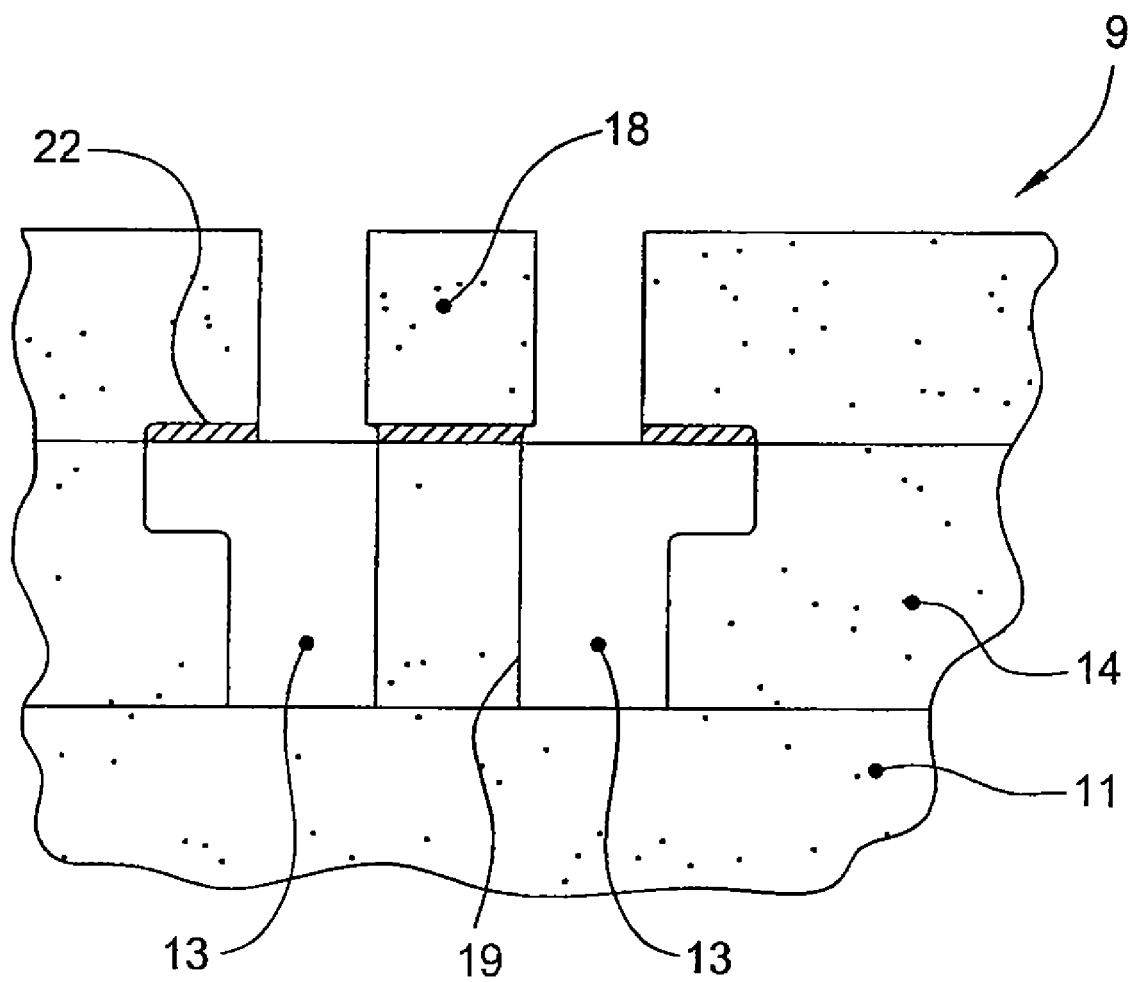
FIG. 5 is a sectional view of an additional embodiment of a formed feature.

FIG. 5 is a sectional view of an additional embodiment of a formed feature. The dielectric material 14 is deposited by a dual damascene process, thus the interconnect opening 19 has conductive material 13 in a shape that does not have a continuous, smooth sidewall. A capping layer 22 is selectively deposited on the conductive material 13. A dielectric layer 18 is deposited upon the capping layer 22. A layer of photoresist (not shown) is deposited upon the feature. A patterning step is performed to remove material beneath the patterned photoresist and the photoresist is removed from the substrate surface. The resulting feature of FIG. 5 has a revealed conductive material surface and a portion of the conductive material engulfed by a capping layer 22 and dielectric layer 18.

Figure 6:
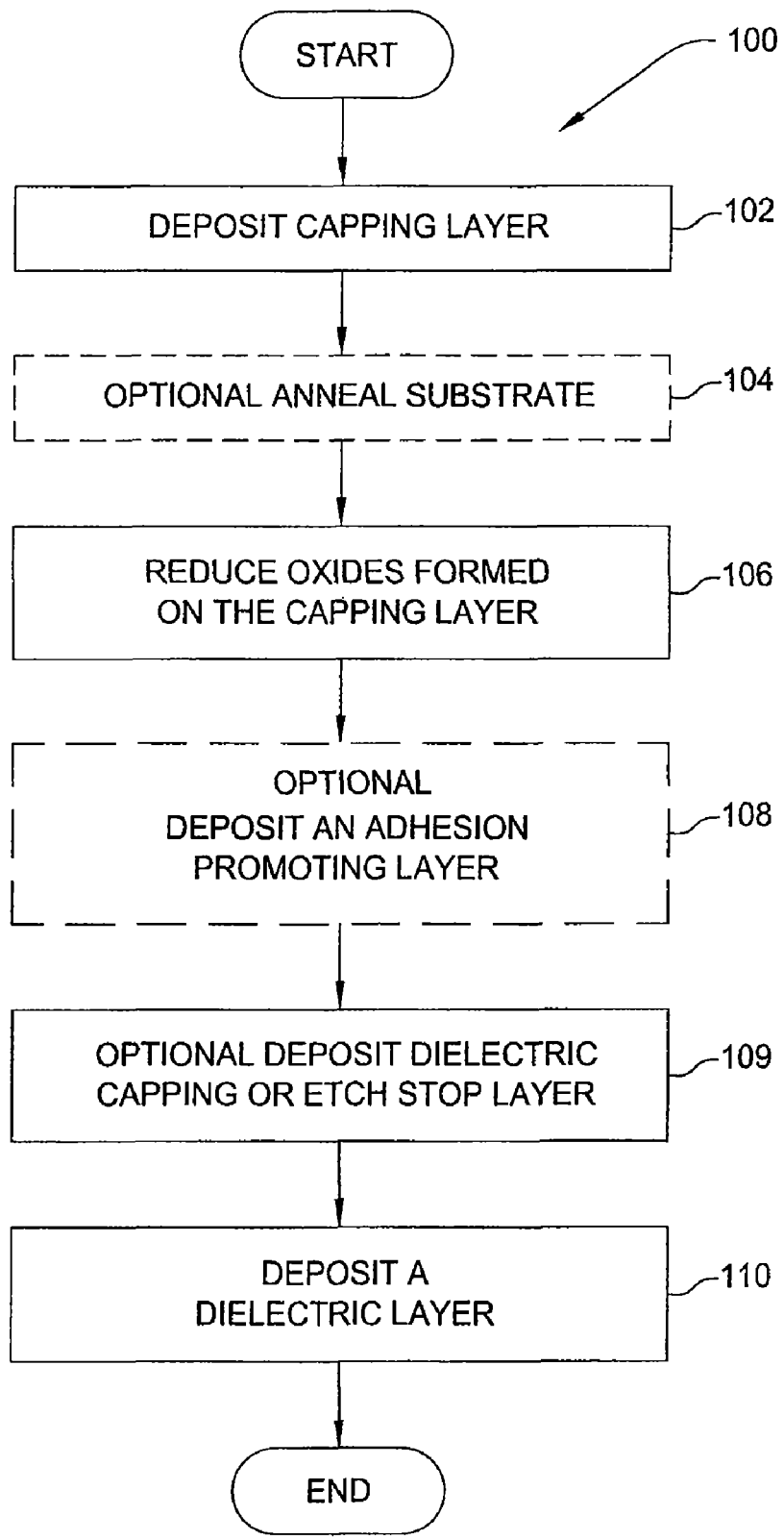
FIG. 6 is a flow diagram of an embodiment of a deposition process.
Figure 7:
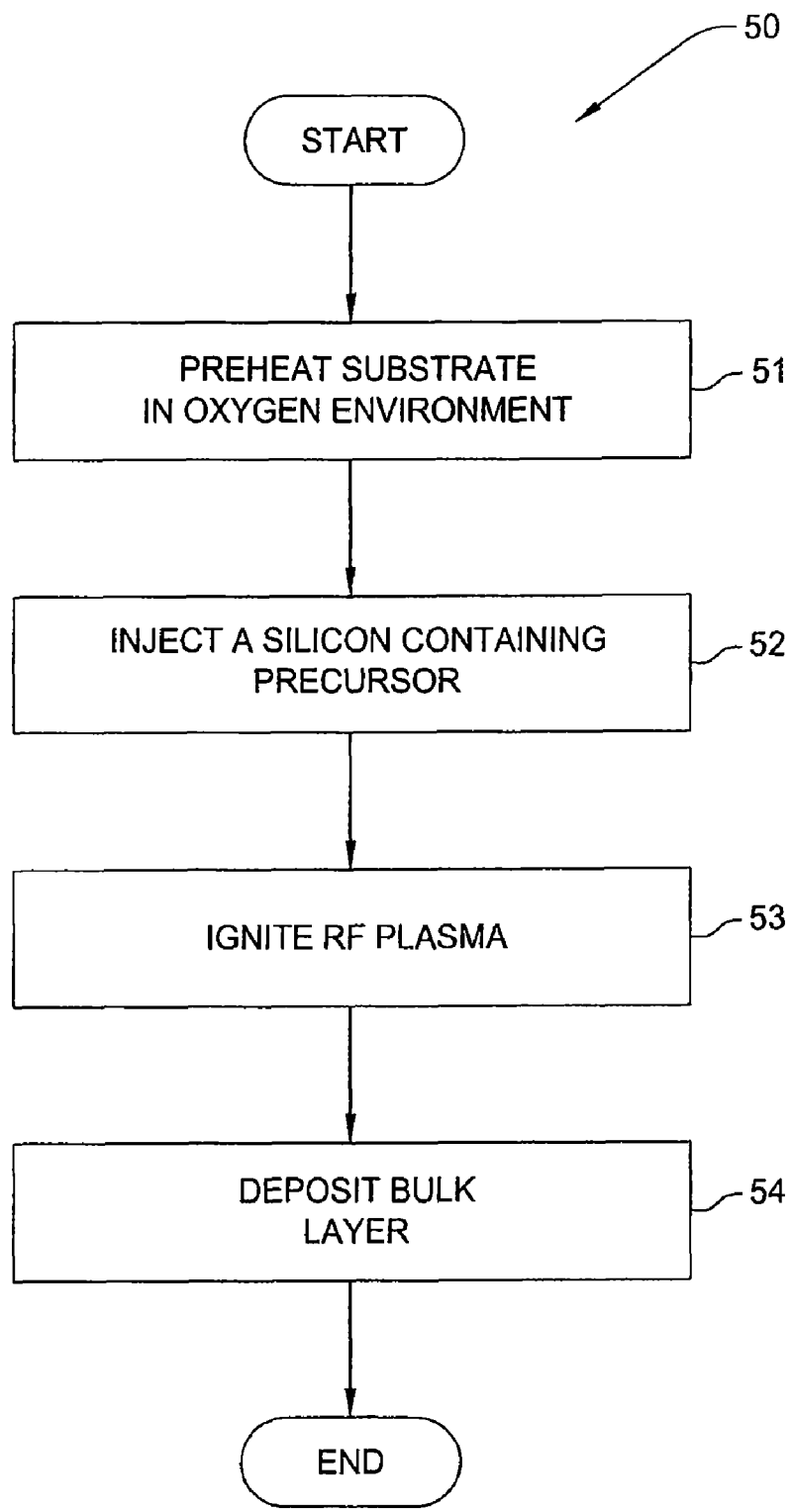
FIG. 7 (prior art) is a flow diagram of an embodiment of a deposition process.

FIG. 6 is a flow diagram of an embodiment of a deposition process 100. A capping layer is deposited upon the conductive material in step 102. U.S. patent application Ser. No. 10/967,099, filed Oct. 15, 2005, which is hereby incorporated by reference herein and U.S. patent application Ser. No. 11/040,962, filed Jan. 22, 2005, which is hereby incorporated by reference herein describe process details for depositing a capping layer upon conductive material. Annealing the substrate may optionally be performed to remove impurities and improve crystalline structure in step 104.

Step 106 reduces the oxides formed on the capping layer by exposing the substrate to an inert gas plasma such as argon or helium plasma, to a reducing gas such as ammonia or hydrogen plasma, or to plasma with a combination of inert gas and reducing gas, ammonia, and hydrogen gases. Plasma methods and apparatus are described in U.S. Pat. No. 6,905,965, filed on Feb. 17, 2004, which is hereby incorporated by reference herein.

In FIG. 6, the step 108 is optional. Depositing an adhesion promoting layer is step 108. The adhesion promotion layer is formed to a thickness of up to 250 Å by introducing silane ($SiH_4$) gas into a chamber. Preferably, a monolayer of about 3 to about 50 Å is deposited. Any silicon containing precursor that will form silicon-cobalt bonds is desirable for forming the adhesion promoting layer. For example, silane may be thermally decomposed to deposit silicon at about 100° C. or more. Forming silicon-cobalt bonds is desirable to improve adhesion between the capping layer and the dielectric deposited thereon.

In one alternative embodiment a TEOS deposition process is used to form a film that meets the desired physical and electrical requirements. An example of a typical PECVD TEOS process used on substrates is embodied in a method whereby the substrate is exposed to the plasma formed by flowing tetraethyloxysilane with carrier gas (e.g., helium) and oxygen in a chamber using a total gas pressure within the range of about 0.5 to about 3 Torr, and a substrate temperature in the range of about 100° C. to about 550° C. Preferably, the chamber pressure is about 1 Torr and the substrate temperature is about 400° C.+/−50° C. An RF power of about 1,000 Watts at a frequency of about 13.56 MHz is delivered to the gas distribution plate at desired substrate process spacing. Silicon dioxide films formed by a TEOS deposition process are commonly used in the semiconductor industry as inter-metal-dielectric films. The TEOS deposition process is typically performed using a dielectric layer forming gas, such as a gas mixture containing tetraethylorthosilicate, to deposit the dielectric layer. Examples of a typical process for depositing with TEOS are further described in the U.S. Pat. No. 5,462,899, entitled "Chemical Vapor Deposition Method for Forming $SiO_2$", filed on Oct. 31, 1995, and U.S. Pat. No. 6,451,390, entitled "Deposition of TEOS Oxide Using Pulsed RF Plasma", filed on Sep. 17, 2002, which are incorporated by reference.

Step 109 is a deposition of a dielectric layer selected for its ability to bond with the capping layer. The dielectric constant of the layer may also be tuned to improve the final device properties. Preferably, the layer is deposited to a thickness of about 50 Å to about 800 Å and is a low dielectric constant material, such as silicon carbide or nitrogen containing silicon carbide having a dielectric constant of about 5 or less. An example of a low k material is BLOk™ dielectric material made by a process that is commercially available from Applied Materials, Inc., of Santa Clara, Calif.

Step 110 is a deposition of a dielectric layer that, like the layer deposited in step 109, is also selected for its dielectric properties. The dielectric material layer may include silicon oxide-based materials. Examples of a dielectric material include silicon oxides, doped silicon oxides, such as PSG, PBSG, and carbon doped silicon oxides. An example of a low k material is Black Diamond™ dielectric material commercially available from Applied Materials, Inc., of Santa Clara, Calif. U.S. patent application Ser. No. 11/145,432, filed Jun. 3, 2005, provides process details for depositing low K materials and is hereby incorporated by reference herein.

Figure 8:
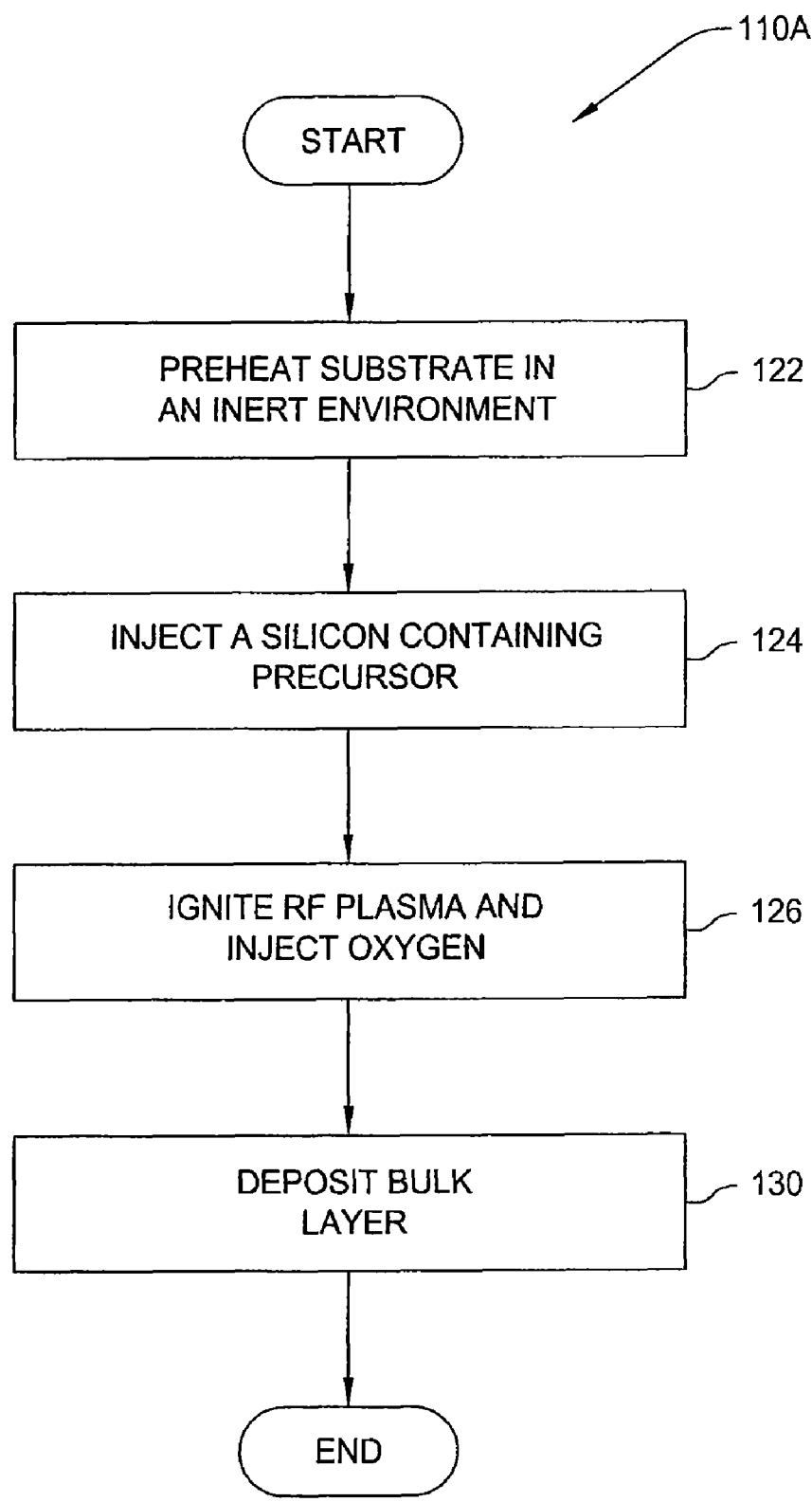
FIG. 8 is a flow diagram of an embodiment of a deposition process.

FIG. 8 is a flow diagram of an embodiment of a deposition process 110A. The step 122 preheats the substrate to about 100° C. to about 500° C. to prepare the substrate for subsequent deposition processes. The silicon or other silicon containing material is introduced into the chamber during step 124. Then, the RF plasma is ignited in step 126. As the plasma is ignited, oxygen is added to the chamber to start the dielectric deposition. Then, in step 130, the bulk dielectric layer is deposited. The final formed feature will resemble the feature in FIG. 3.

Figure 9:
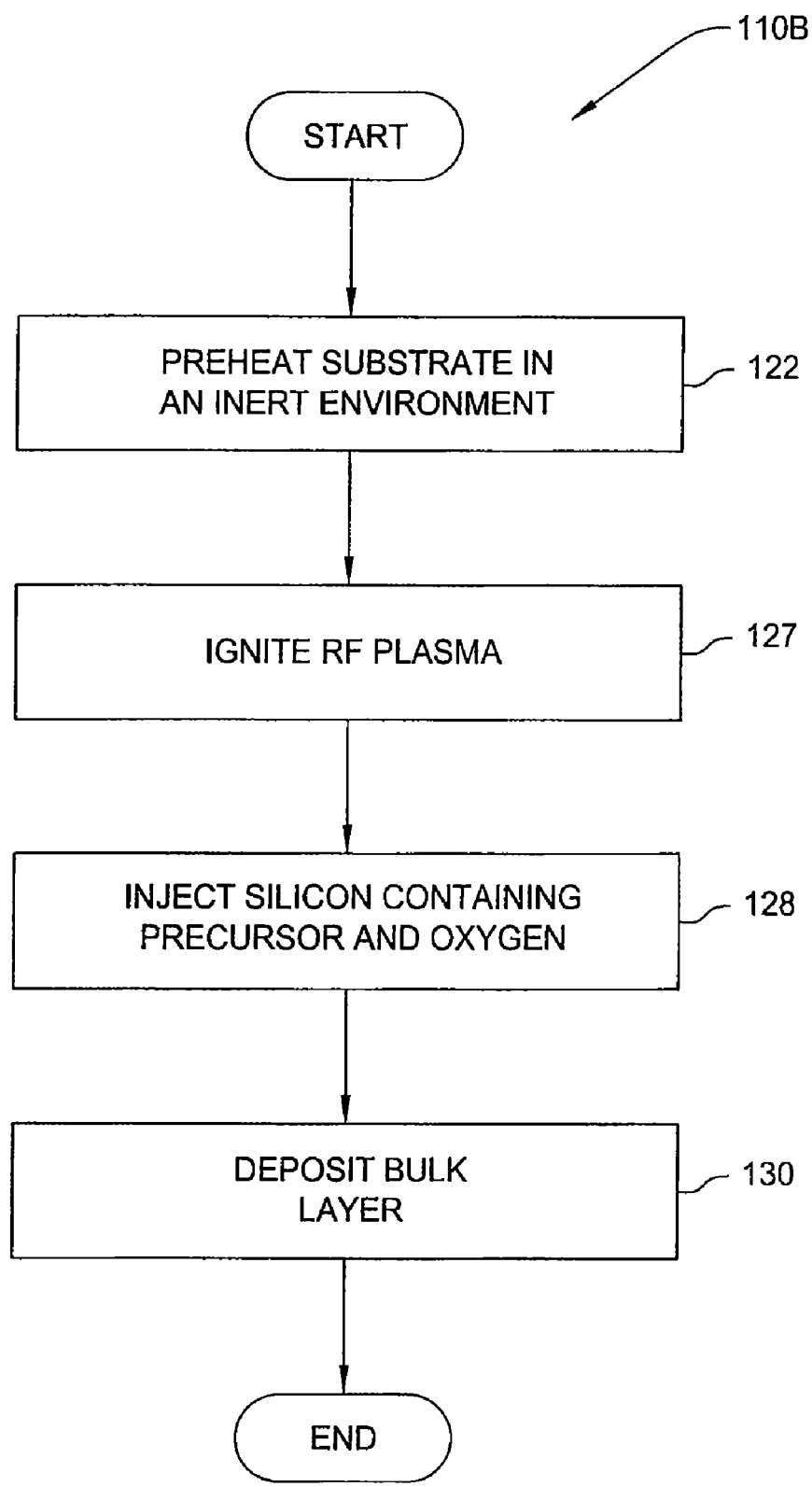
FIG. 9 is a flow diagram of an additional embodiment of a deposition process.

FIG. 9 is a flow diagram of an additional embodiment of a deposition process 110B. The process of FIG. 9 is similar to the process of FIG. 8, however there is no silicon containing precursor soak step before igniting the plasma. The substrate is preheated in an inert environment in step 122. The plasma is ignited during step 127. The silicon containing precursor and oxygen are introduced to the chamber to form cobalt silicon bonds along the surface of the capping layer in step 128. The bulk layer is deposited across the surface of the substrate in step 130.

Figure 10:
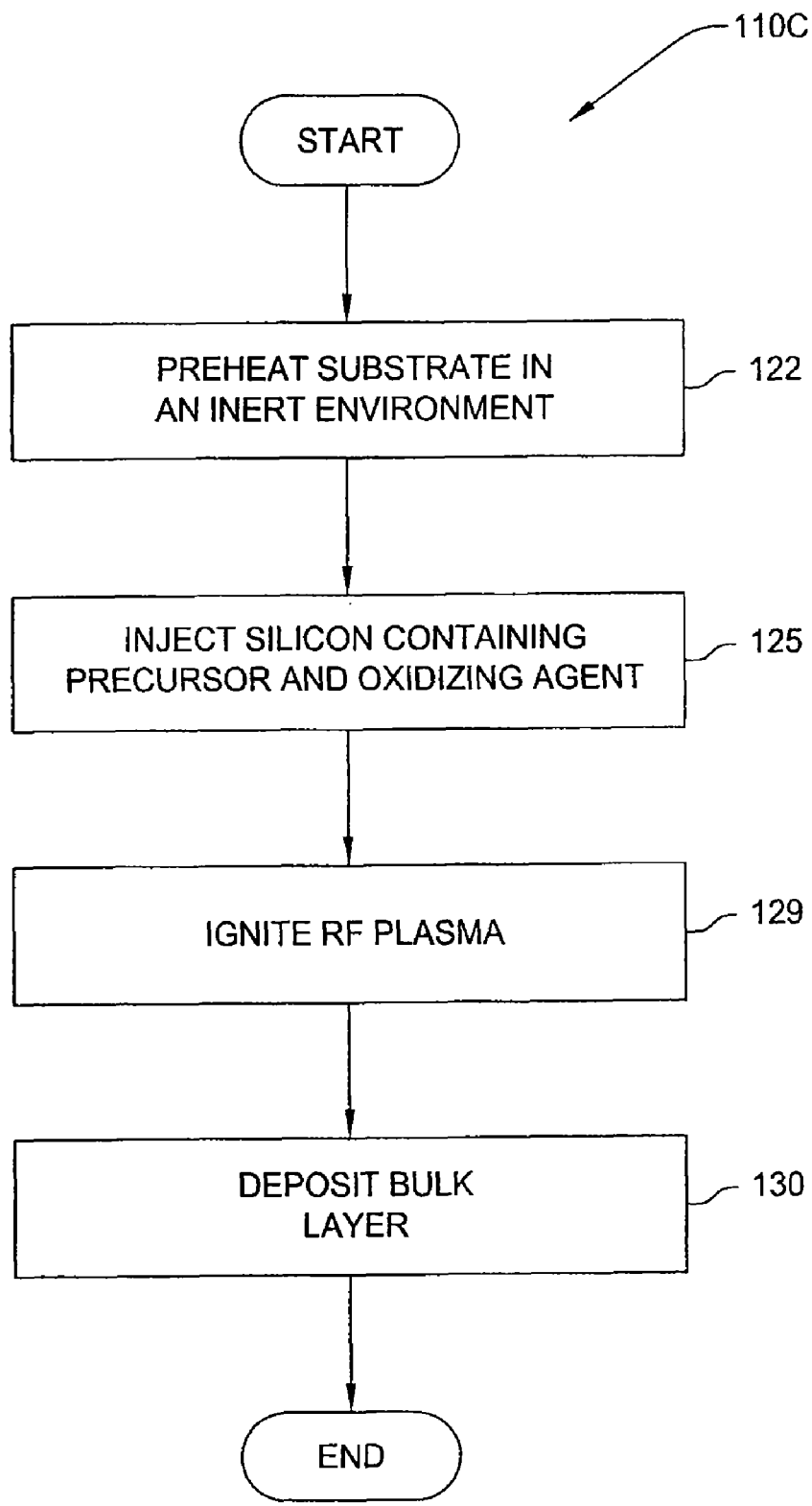
FIG. 10 is a flow diagram of an additional embodiment of a deposition process.

FIG. 10 is a flow diagram of an additional embodiment of a deposition process 110C. The process of FIG. 10 is comparable to the process of FIG. 9. However, both the alternative silicon containing precursor and oxidizing agent are added to soak the surface of the substrate before striking the plasma. The substrate is heated during step 122. The silicon containing precursor and oxidizing agent are added to the chamber during step 125. The alternative oxidizing agent is chosen for its milder oxidizing capability. Oxygen and/or nitrous oxide may be used as an oxidizing agent. Step 129 is igniting the plasma. Next, the bulk dielectric is deposited in step 130.

A capping layer on the conductive material is desirable because it helps prevent electromigration and diffusion. It may even eliminate the need for some dielectric layers such as capping or etch stop layers. Argon or helium is the preferred gases for plasma based processing steps. Protecting the capping layer from oxygen exposure at elevated temperature to prevent cobalt oxide formation is important because it reduces the likelihood of etching away the capping layer during subsequent wet clean processes. Ashing processes for removing photoresist also must be adjusted to use lower oxygen concentration and lower temperatures to minimize oxidation. Alternative ashing processes involving reducing gases, such as ammonia may be used instead of oxygen to remove the photoresist. The processing steps before the deposition of the capping layer prevent oxide formation.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising: depositing a capping layer comprising a cobalt alloy on a conductive material comprising a metal disposed on the substrate, wherein the cobalt alloy has a cobalt concentration within a range from about 85 atomic percent to about 95 atomic percent; annealing the capping layer; depositing an adhesion promoting layer on the capping layer; and depositing a bulk dielectric layer on the adhesion promoting layer; wherein depositing the adhesion promoting layer comprises: heating the substrate to a temperature of about 100° C. or greater; exposing the capping layer to a silicon containing precursor and an oxidizing agent during a plasma enhanced chemical vapor deposition process; and decomposing the silicon containing precursor while forming silicon-cobalt bonds along the surface of the capping layer and within the adhesion promoting layer.

2. The method of claim 1, wherein the capping layer has a thickness within a range from about 10 Å to about 500 Å.

3. The method of claim 1, wherein the method further comprises reducing oxides formed on the capping layer, after the step of annealing the capping layer, by exposing the capping layer to a plasma selected from the group consisting of argon plasma, helium plasma, hydrogen plasma, and ammonia plasma.

4. The method of claim 1, wherein the cobalt alloy has an oxygen concentration within a range from about $5\times10^{18}$ atoms/cm$^3$ to about $5\times10^{19}$ atoms/cm$^3$.

5. The method of claim 1, wherein the adhesion promoting layer has a thickness of up to 250 Å.

6. The method of claim 1, wherein the silicon containing precursor is gaseous silane or tetraethyloxysilane.

7. The method of claim 1, wherein cobalt silicide is formed between the capping layer and the bulk dielectric layer.

8. A method for processing a substrate, comprising: depositing a capping layer comprising a cobalt alloy on a conductive material comprising a metal disposed on the substrate, wherein the cobalt alloy has a cobalt concentration within a range from about 85 atomic percent to about 95 atomic percent; annealing the capping layer; depositing an adhesion promoting layer on the capping layer; and depositing a bulk dielectric layer on the adhesion promoting layer; wherein depositing the adhesion promoting layer comprises: heating the substrate to a temperature within a range from about 100° C. to about 550° C.; and exposing the capping layer to a plasma formed by flowing a silicon containing precursor and an oxidizing agent through a gas distribution plate within a chamber during a plasma enhanced chemical vapor deposition process.

9. The method of claim 8, wherein the capping layer has a thickness within a range from about 10 Å to about 500 Å.

10. The method of claim 8, wherein the method further comprises reducing oxides formed on the capping layer, after the step of annealing the capping layer, by exposing the capping layer to an initial plasma selected from the group consisting of argon plasma, helium plasma, hydrogen plasma, and ammonia plasma.

11. The method of claim 8, wherein the cobalt alloy has an oxygen concentration within a range from about $5\times10^{18}$ atoms/cm$^3$ to about $5\times10^{19}$ atoms/cm$^3$.

12. The method of claim 8, wherein the adhesion promoting layer has a thickness of up to 250 Å.

13. The method of claim 8, wherein the silicon containing precursor is gaseous silane or tetraethyloxysilane.

14. The method of claim 8, wherein cobalt silicide is formed between the capping layer and the bulk dielectric layer.

15. The method of claim 8, wherein the oxidizing agent comprises oxygen, nitrous oxide, or combinations thereof.

16. The method of claim 1, wherein the conductive material comprises the metal selected from the group consisting of tungsten, copper, aluminum, and alloys thereof.

17. The method of claim 16, wherein the conductive material comprises copper or a copper alloy.

18. The method of claim 1, wherein the cobalt alloy further comprises tungsten or molybdenum, phosphorus, boron, or combinations thereof.

19. The method of claim 18, wherein the cobalt alloy comprises tungsten or molybdenum, and has a tungsten concentration or a molybdenum concentration within a range from about 1 atomic percent to about 6 atomic percent.

20. The method of claim 8, wherein the conductive material comprises the metal selected from the group consisting of tungsten, copper, aluminum, and alloys thereof.

21. The method of claim 20, wherein the conductive material comprises copper or a copper alloy.

22. The method of claim 8, wherein the cobalt alloy further comprises tungsten or molybdenum, phosphorus, boron, or combinations thereof.

23. The method of claim 22, wherein the cobalt alloy comprises tungsten or molybdenum, and has a tungsten concentration or a molybdenum concentration within a range from about 1 atomic percent to about 6 atomic percent.

* * * * *